United States Patent [19]

Wang et al.

[11] Patent Number: 5,781,475
[45] Date of Patent: Jul. 14, 1998

[54] SIMPLIFIED PAGE MODE PROGRAMMING CIRCUIT FOR EEPROM REQUIRING ONLY ONE HIGH VOLTAGE LINE FOR SELECTING BIT LINES

[75] Inventors: Fu-Chung Wang; Shao-Yi Wu, both of Hsinchu, Taiwan

[73] Assignee: Holtek Microelectronics, Inc., Hsinchu, Taiwan

[21] Appl. No.: 856,917

[22] Filed: May 15, 1997

[51] Int. Cl.⁶ .................................................. G11C 16/04
[52] U.S. Cl. ............................... 365/185.18; 365/185.23
[58] Field of Search ........................ 365/185.18, 185.23, 365/238.5, 189.05, 185.11

[56] References Cited

U.S. PATENT DOCUMENTS 5,101,379  3/1992  Lin et al. ........................ 365/185.05
5,615,149  3/1997  Kobayashi et al. ............... 365/185.12
5,621,689  4/1997  Sakakibara et al. .............. 365/189.09

*Primary Examiner*—David C. Nelms
*Assistant Examiner*—Hoai Ho
*Attorney, Agent, or Firm*—W. Wayne Liauh

[57] ABSTRACT

An apparatus for page mode programming of an EEPROM cell array applications is described. The apparatus comprises a control gate potential control means and a bit line potential control means. The control gate potential control means is connected to the control gate of the EEPROM cell to select the potential for the control gate of the EEPROM cell, while the bit line potential control means is connected to the bit line of the EEPROM cell to select the potential for the bit line. A bit line of the EEPROM cell is first selected by a bit line control signal, then a control gate control signal determines whether provides the high voltage to the control gate of the EEPROM cell.

2 Claims, 3 Drawing Sheets

SIMPLIFIED PAGE MODE PROGRAMMING CIRCUIT FOR EEPROM REQUIRING ONLY ONE HIGH VOLTAGE LINE FOR SELECTING BIT LINES

BACKGROUND OF THE INVENTION (1) Field of the Invention

This invention relates to a page mode programming apparatus for electrical erase programmable read only memory (EEPROM) applications, and more particularly to the control circuit design of selecting control gate and bit line voltages of an EEPROM cell.

(2) Description of the Prior Art

In general, a page mode programming of an EEPROM cell includes load, erase and write sequences. Referring now to FIG. 1, there is shown the conventional control circuit diagram of an EEPROM cell 2, which comprises a bit line load element 11, a bit line path control circuit 12, an erase control circuit 13, a word line path control circuit 14, a sense amplifier 15, a load data buffer 16, a charge pump circuit 17 and a write $V_{pp}$ control circuit 18 (For example, see U.S. Pat. No. 4,785,424 to Lin et al., and its continuation U.S. Pat. No. 5,101,379, the entire disclosures of which are herein incorporated by reference). And FIG. 2 is the timing charts of the control signals which are corresponding to FIG. 1, when a particular bit line is selected.

The conventional control circuit needs two high voltage (generating from charge pump) lines to select which bit line conducts: one control signal SEN provides a high voltage to the control gate of the EEPROM cell 2 while the other control signal YN controls the bit line (BL). This circuit design has two high voltage lines to control the bit line and control gate separately that makes the EEPROM operations more complicated and costly.

SUMMARY OF THE INVENTION

The primary object of the present invention provides a modified control circuit design of an EEPROM cell to make the page mode programming operation easier.

In accordance with the object of the present invention, a novel control circuit design is disclosed. The control circuit only comprises a charge pump to provide the high voltage to the control gate of the EEPROM cell based on which bit line is first selected.

Since there is only one high voltage line according to the present invention that is unlike the conventional circuit which is consist of two high voltage lines connected to both control signals YN and SEN, the control signals YN and SEN can still utilize normal work voltage source (i.e. 5V) that is one of the key points of the present invention.

The other unique feature of the present invention is its data load operation that the data latches only change their status with a binary logical "0" while both the default state and the state after the completion of programming are set to a binary logical "1". It is unlike the conventional design which loads data with either "0" or "1" inputs and the latches are kept the same data as the previously loaded data when it is in standby mode. Because EEPROM erases old information before each writing cycle, that is equivalent to write a binary logical "1" into the EEPROM cell, the latches of the present invention are always at high potential except during the writing a binary logic "0" operation.

BRIEF DESCRIPTION OF THE DRAWINGS

The accompanying drawings form a material part of this description, in which:

FIG. 4 shows the timing charts of the control signals which are corresponding to FIG. 3, when a particular bit line is selected according to the preferred embodiment of the present invention.

DESCRIPTION OF THE PREFERRED EMBODIMENT

The invention discloses herein is directed to a modified control circuit design of an EEPROM cell. In the following description, numerous details are set forth in order to provide a thorough understanding of the present invention. It will be appreciated by one skilled in the art that variations of these specific details are possible while still achieving the results of the present invention.

Figure 1:
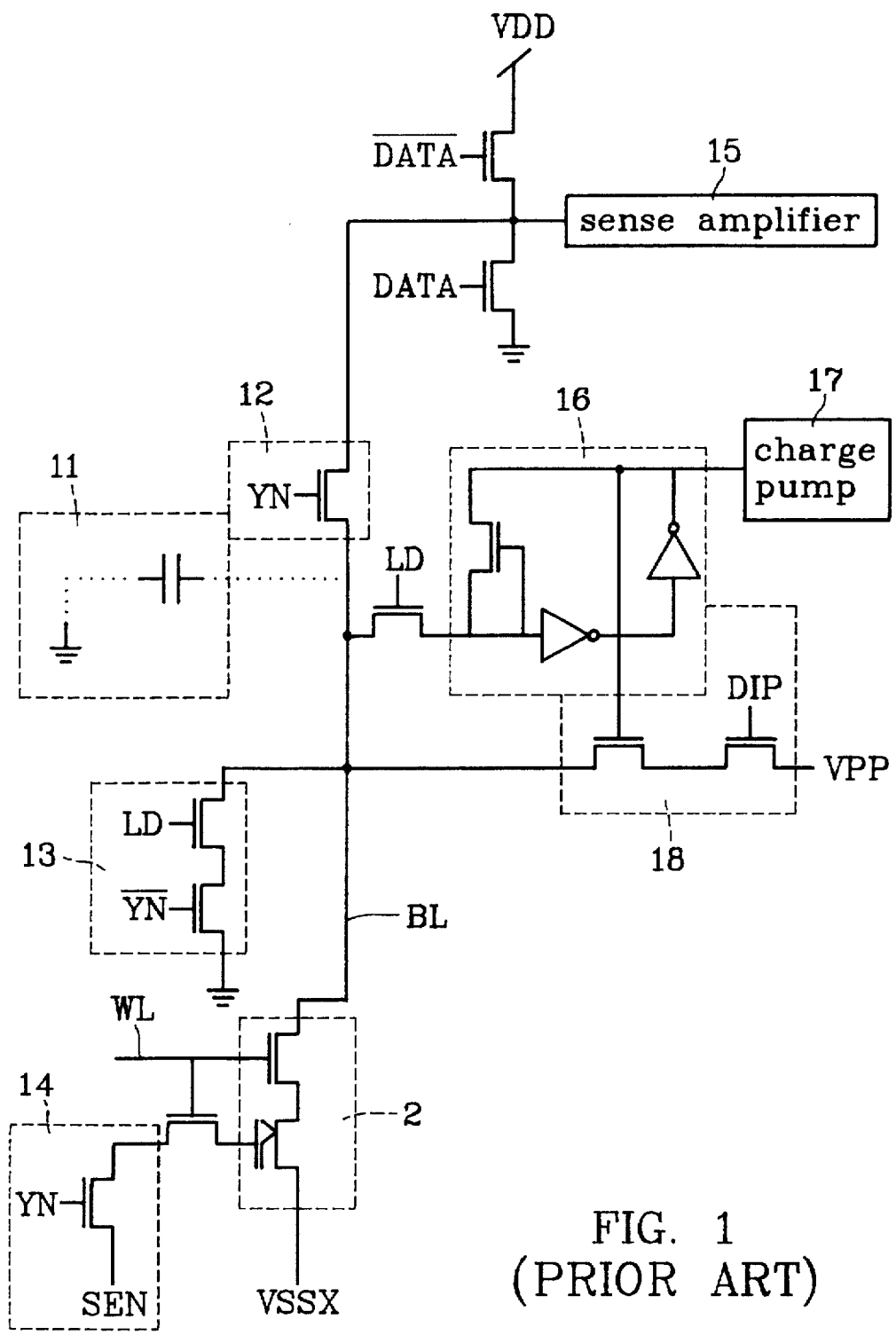
FIG. 1 shows a schematic diagram of an EEPROM cell and its associated control circuit according to the prior art.
Figure 2:
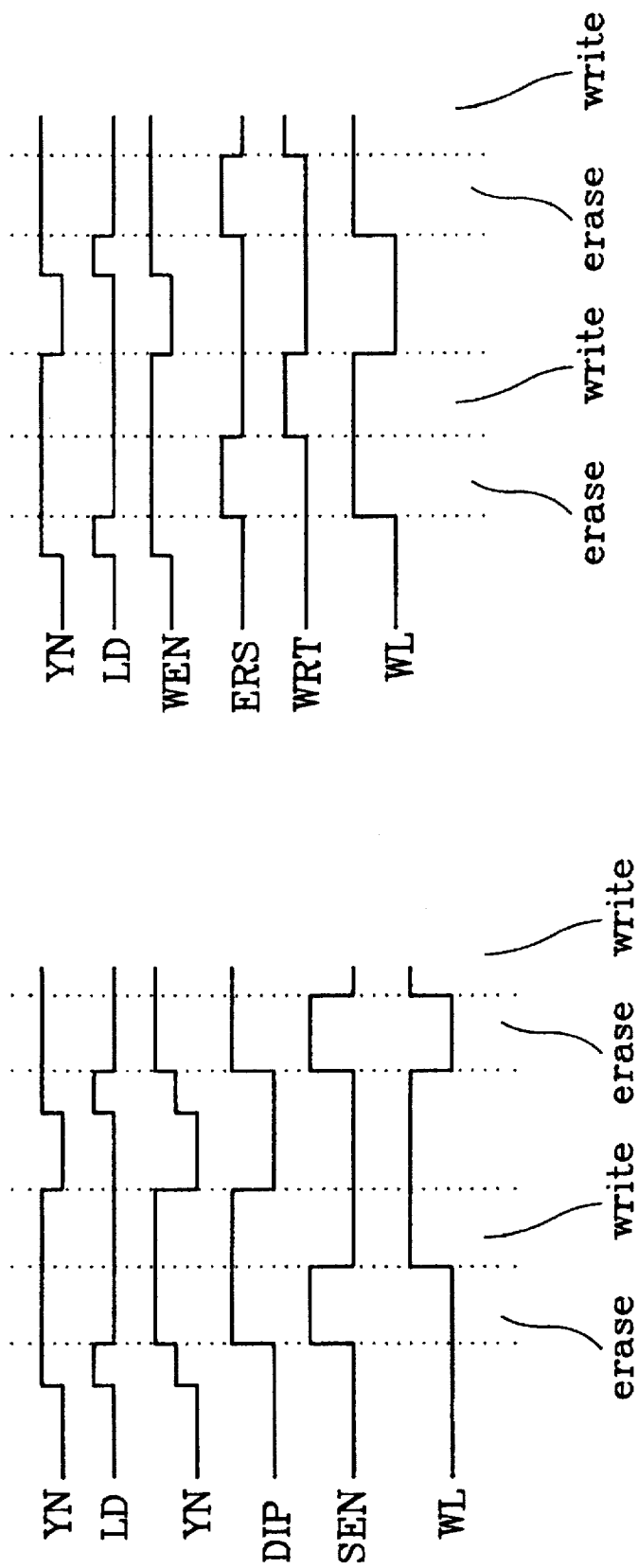
FIG. 2 shows the timing charts of the control signals which are corresponding to FIG. 1, when a particular bit line is selected.
Figure 3:
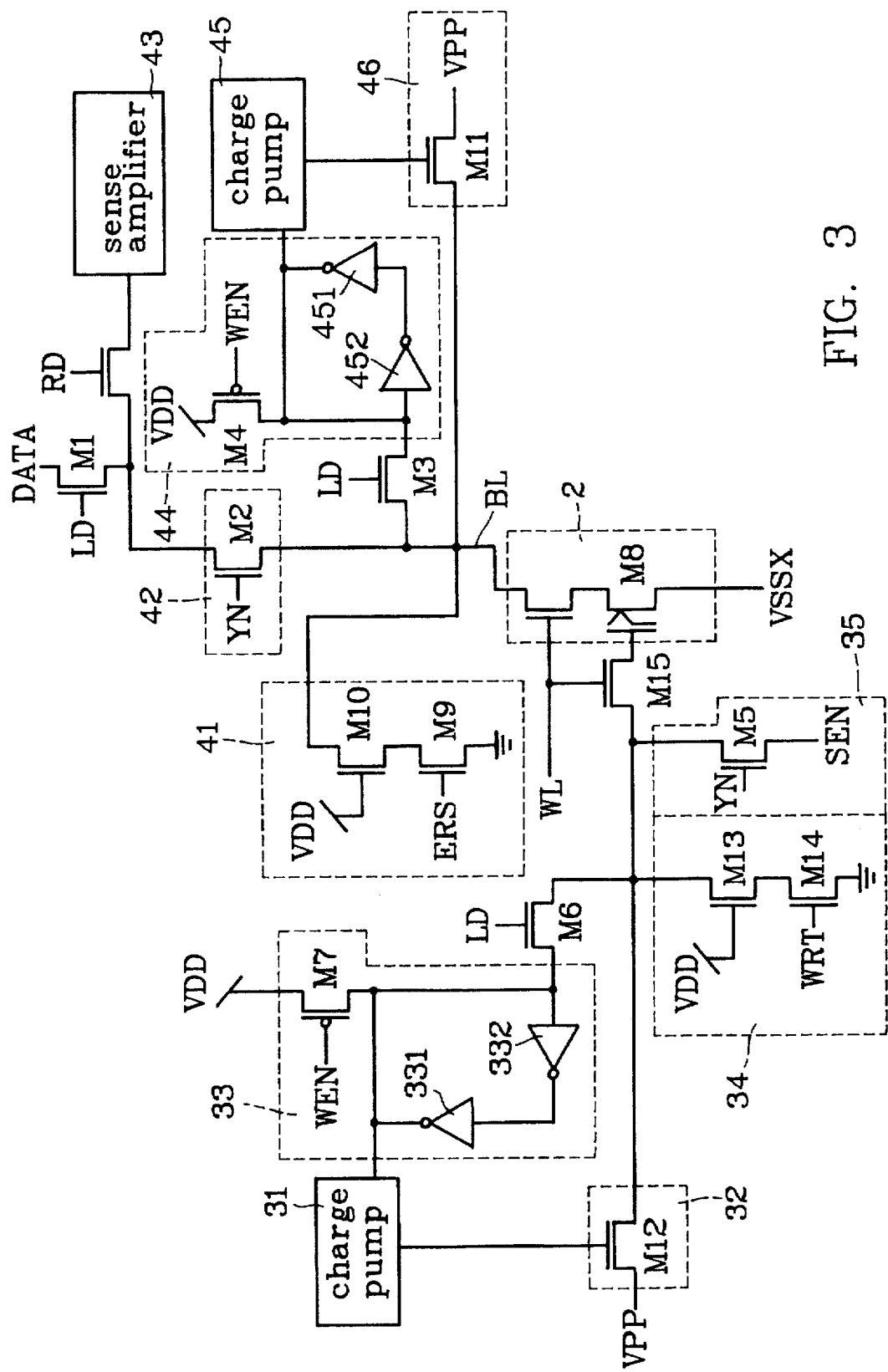
FIG. 3 shows a schematic diagram of an EEPROM cell and its associated control circuit according to the preferred embodiment of the present invention.

Referring now more particularly to FIG. 3, there is shown a schematic diagram of the page mode programming of an EEPROM cell and its associated control circuit according to the preferred embodiment of the present invention. The control circuit is basically consist of a control gate potential control part for the EEPROM cell and a bit line (BL) potential control part.

The control gate potential control circuit comprises of a charge pump 31, an erase $V_{pp}$ control means 32, a load write buffer 33, a write control means 34, and a word line path control means 35. The load write buffer 33 depends on an enable signal WEN to control whether the seventh transistor M7 conducts or not, that sets initial states and the states after each write mode completion of the first inverter 331 and second inverter 332 to be logical "1". During a write cycle, WEN is in low state, the latch control signal LD is in high state to open the sixth transistor M6. In addition, YN of the word line path control means 35 is also in high state to transmit SEN signal through the fifth transistor M5 and sixth transistor M6 into the latch loop of the load write buffer 33.

When the latch of the load write buffer 33 goes high (i.e. logical "1"), the twelfth transistor M12 of the erase $V_{pp}$ control means 32 does not conduct, causing the EEPROM cell 2 stays unchanged. On the other hand, when the latch of the load write buffer 33 goes low (i.e. logical "0"), the charge pump 31 produces a high voltage about 21V to cause the twelfth transistor M12 conducting, therefore, the EEPROM cell 2 performs erasing.

During a writing cycle, both the selected word line (WL) and the write enable signal WRT are in high states, a logical "0" signal is then passing through the fourteenth transistor M14, thirteenth transistor M13 and fifteenth transistor M15 into the gate of the eighth transistor M8, causing the EEPROM cell 2 to write.

Likewise, the bit line (BL) potential control circuit comprises of an erase control means 41, a Y-pass control means 42, a load data buffer 44, a charge pump 45, and a write $V_{pp}$ control means 46. The load data buffer 44 depends on an enable signal WEN to control whether the fourth transistor M4 conducts or not, that sets initial states and the states after each write mode completion of the third inverter 451 and forth inverter 452 to be logical "1". During a write cycle, WEN is in low state, the latch control signal LD is in high state to open the third transistor M3. Besides, YN of the Y-pass control means 42 is also in high state to transmit the DATA through the first transistor M1, second transistor M2 and third transistor M3 into the latch loop of the load data buffer 44.

When the latch of the write $V_{pp}$ control means 46 goes high (i.e. logical "1"), the eleventh transistor M11 does not conduct, causing the EEPROM cell 2 stays at erasing mode. On the other hand, when the latch of the write $V_{pp}$ control means 46 goes low (i.e. logical "0"), the charge pump 45 produces a high voltage about 21V to cause the eleventh transistor M11 conducting, therefore, the EEPROM cell 2 performs writing.

During an erasing cycle of the erase control means 41, the erase enable signal ERS is in high states, a logical "0" signal is then passing through the ninth transistor M9, and tenth transistor M10 into the bit line BL, causing the EEPROM cell 2 to perform erasing.

Finally, during a data loading cycle, the data saved in the EEPROM cell 2 are sent to the sense amplifier 43 where the loading is occurred through a transistor controlled by a read enable signal RD based upon the proper timing of its associated control circuit.

Since there is only one high voltage line according to the present invention that is unlike the conventional circuit which is consist of two high voltage lines connected to both control signals YN and SEN, the control signals YN and SEN can still utilize normal work voltage source (i.e. 5V) that makes the page mode programming operation easier and more reliable.

OPERATIONAL EXAMPLES OF THE PREFERRED EMBODIMENT

There are three types of control cycles: loading, erasing, and writing undertaken for the page mode programming of an EEPROM cell according to the present invention. Referring now to FIG. 4, there is shown the timing charts of the control signals which are corresponding to FIG. 3, when a particular bit line is selected according to the preferred embodiment of the present invention. The operational examples will discuss in details in the following:

(1) Before Writing

Since WEN is in low state (i.e. "0") as shown in FIG. 4, that opens the transistor M4 to transmit a voltage $V_{DD}$ into the load data buffer 44 which sets the latch in a high state (i.e. "1"). Meanwhile, the transistor M7 also opens to transmit the voltage $V_{DD}$ into the load write buffer 33 which sets the latch in a high state (i.e. "1") as well.

(2) During Loading a. Selected Page Write Buffer

Since YN of a selected page write buffer is in high state (i.e. "1") as shown in FIG. 4, the data logical "1" is loading through transistors M1, M2, and M3 into the load data buffer 44 when both latch control signal LD and DATA are in high states. Meanwhile, WEN is in high state during loading cycle that causes transistor M4 not conducting. Besides, SEN is logical "0", YN is in high state, therefore, a logical "0" potential is transmitted through transistors M5 and M6 into the load write buffer 33. Similarly, the data logical "0" is also loading through transistors M1, M2, and M3 into the load data buffer 44 when the latch control signal LD is in high states. At the same time, SEN is "0", YN is in high state, therefore, a logical "0" potential is transmitted through transistors M5 and M6 into the load write buffer 33.

b. Unselected Page Write Buffer

Since YN of an unselected page write buffer is in low state (i.e. "0") as shown in FIG. 4, the transistor M2 dose not conduct. At the same time, erase control signal ERA is in low state that causes the erase control means 41 standing by. Meanwhile, the latched DATA is logical "1" and YN is low that causes the transistor M5 not conducting. Besides, write control signal WRT is in low state that makes the erase control means 41 standing by too. Therefore, the state of the first load data buffer 33 is kept the same as its previous state logical "1".

(3) During Erasing

When a page is selected, the data in the load write buffer 33 is logical "0" as shown in FIG. 4, that enables the charge pump 31 to produce a 21V high voltage to the gate of the transistor M12. At the same time, $V_{pp}$ is raising form 4.5V to about 21V and passing through transistors M12, M15 (word line WL is also 21V) to the control gate of the EEPROM cell 2, and $V_{SSX}$ is 0V. In addition, erase control signal ERA is in high state, thus a logical "0" potential is passing through the transistors M9, M10 into the bit line BL to cause electrons tunneling from bit line BL to the floating gate of the EEPROM cell 2 that can be regarded as writing a logical "1" in the EEPROM cell.

On the other hand, when a page is unselected, the data in the load write buffer 33 is logical "1" as shown in FIG. 4 that turns off the charge pump 31, thus the transistor M12 does not conduct. At the same time, word line WL is also 0V which means the control gate of transistor M8 in the EEPROM cell 2 floating. In addition, erase control signal ERA is in high state, therefore, a logical "0" potential is passing through the transistors M9, M10 into the bit line BL. Besides, $V_{SSX}$ is also 0V that makes the EEPROM cell 2 in standing by mode.

(4) During Writing

When a page is selected, the data in the load data buffer 44 is logical "0" as shown in FIG. 4 that enables the charge pump 45 to produce a 21V high voltage to the gate of the transistor M11. At the same time, $V_{pp}$ is raising form 4.5V to about 21V and passing through the transistor M11 to bit line BL. In addition, write control signal WRT is in high state, thus a logical "0" potential is passing through the transistors M14, M13, and M15 into the control gate of transistor M8 in the EEPROM cell 2, and $V_{SSX}$ is 0V. Therefore, the electrons are tunneling from the floating gate of the EEPROM cell 2 to drain (bit line BL) that can be regarded as writing a logical "0" in the EEPROM cell. Similarly, if the data logical "1" is loading into the load data buffer 44, charge pump 45 would stand by and high voltage $V_{pp}$ does not send to bit line BL (BL floating) that effects the EEPROM cell 2 in standing by mode too.

On the other hand, when a page is unselected, the data in the load data buffer 44 is logical "1" as shown in FIG. 4 that turns off the charge pump 45, thus high voltage $V_{pp}$ does not send to bit line BL (BL floating). Besides, word line WL is unselected as well that makes the control gate of transistor M8 in the EEPROM cell 2 floating which also means the EEPROM cell 2 in standing by mode.

While the invention has been particularly shown and described with reference to a preferred embodiment, it will be understood by those skilled in the art that various changes in form and detail may be made therein without departing from the spirit and scope of the present invention.

What is claimed is:

1. An apparatus for page mode programming of an EEPROM cell array, comprising:

a gate potential control means connected to a control gate of said EEPROM cell, wherein said gate potential control means comprises a first charge pump for providing a first high voltage to said control gate of said EEPROM cell;

a bit line potential control means connected to a plurality of bit lines of said EEPROM cell, wherein said bit line potential control means comprises a second charge pump for providing a second high voltage to the bit lines of said EEPROM cell;

further wherein said gate potential control means comprises:

a load write buffer having first and second ends, said first end of said load write buffer is connected to said first charge pump which is controlled by an enable signal, while said second end of said load write buffer is connected to a word line of said EEPROM cell through a first transistor which is controlled by a latch signal;

an erase control means comprising a second transistor, when data latched in said load writer buffer is logical "1", said second transistor is not conducting, thus said first charge pump is turned off to keep said EEPROM cell standing by, on the other hand, when data latched in said load write buffer is logical "0", said second transistor is conducting which turns on said first charge pump to send a high voltage of about 21V into said control gate of said EEPROM cell, therefore said EEPROM cell performs erasing;

a write control means which is controlled by a write control signal to send a logical "0" into said word line of said EEPROM cell for writing; and a word line path control means which is controlled by a control gate control signal to determine whether or not to send a control gate control signal SEN into said word line of said EEPROM cell.

2. An apparatus for page mode programming of an EEPROM cell array, comprising:

a gate potential control means connected to a control gate of said EEPROM cell, wherein said gate potential control means comprises a first charge pump for providing a first high voltage to said control gate of said EEPROM cell;

a bit line potential control means connected to a plurality of bit lines of said EEPROM cell, wherein said bit line potential control means comprises a second charge pump for providing a second high voltage to the bit lines of said EEPROM cell;

further wherein said bit line potential control means comprises:

a load data buffer having first and second ends, said first end of said load data buffer is connected to said second charge pump which is controlled by an enable signal, while said second end of said load data buffer is connected to a bit line of said EEPROM cell through a third transistor which is controlled by a latch signal;

a write control means comprising a fourth transistor, wherein when data latched in said load data buffer is logical "1", said fourth transistor is not conducting, thus said second charge pump is turned off to keep said EEPROM cell stay in erasing mode, on the other hand, when data latched in said load data buffer is logical "0", said fourth transistor is conducting which turns on said second charge pump to send a high voltage of about 21V into the control gate of said EEPROM cell, therefore said EEPROM cell performs writing;

an erase control means which is controlled by an erase control signal to send a logical "0" into the bit line of said EEPROM cell for erasing;

a Y-pass control means which is controlled by a gate control signal to determine whether or not to send a gate control signal SEN into said word line of said EEPROM cell.

* * * * *